United States Patent
Bronczyk et al.

(10) Patent No.: US 9,069,029 B2
(45) Date of Patent: Jun. 30, 2015

(54) DETECTION AND COMPENSATION OF MULTIPLEXER LEAKAGE CURRENT

(75) Inventors: Andrew James Bronczyk, Chanhassen, MN (US); Charles Edwin Goetzinger, Chanhassen, MN (US); Jason Harold Rud, Mayer, MN (US)

(73) Assignee: Rosemount Inc., Shakopee, MN (US)

( * ) Notice: Subject to any disclaimer, the term of this patent is extended or adjusted under 35 U.S.C. 154(b) by 651 days.

(21) Appl. No.: 13/325,914

(22) Filed: Dec. 14, 2011

(65) Prior Publication Data

US 2012/0086461 A1 Apr. 12, 2012

Related U.S. Application Data

(62) Division of application No. 12/584,468, filed on Sep. 4, 2009, now Pat. No. 8,098,696.

(51) Int. Cl.
- *G01R 31/14* (2006.01)
- *G01R 31/02* (2006.01)
- *G01R 31/30* (2006.01)
- *H03K 17/693* (2006.01)

(52) U.S. Cl.
CPC ............ *G01R 31/025* (2013.01); *G01R 31/024* (2013.01); *G01R 31/14* (2013.01); *G01R 31/3008* (2013.01); *H03K 17/693* (2013.01)

(58) Field of Classification Search
CPC ..... G01R 31/14; G01R 31/024; G01R 31/025
See application file for complete search history.

(56) References Cited

U.S. PATENT DOCUMENTS

| | | | |
|---|---|---|---|
| 4,800,513 A | 1/1989 | Deutsch | |
| 4,891,807 A | 1/1990 | Hutch | |
| 5,499,023 A * | 3/1996 | Goldschmidt | 340/870.37 |
| 6,008,664 A * | 12/1999 | Jett et al. | 324/762.02 |
| 6,051,895 A | 4/2000 | Mercier | |
| 6,541,980 B2 | 4/2003 | Maki | |
| 7,446,549 B2 | 11/2008 | Tomita et al. | |
| 7,545,200 B2 * | 6/2009 | Kreda | 327/530 |
| 7,996,587 B2 | 8/2011 | Rugo et al. | |
| 8,098,696 B2 * | 1/2012 | Bronczyk et al. | 370/537 |
| 2009/0079434 A1* | 3/2009 | Osawa et al. | 324/434 |
| 2009/0132789 A1* | 5/2009 | Rao et al. | 712/36 |
| 2013/0018597 A1* | 1/2013 | Gofman et al. | 702/23 |

FOREIGN PATENT DOCUMENTS

| JP | 61025322 A | 2/1986 |
|---|---|---|
| JP | 6061962 A | 3/1994 |

OTHER PUBLICATIONS

The International Search Report and Written Opinion in related International Application No. PCT/US2010/002321 filed Aug. 24, 2010.

* cited by examiner

*Primary Examiner* — Huy Q Phan
*Assistant Examiner* — Adam Clarke
(74) *Attorney, Agent, or Firm* — Kinney & Lange, P.A.

(57) ABSTRACT

A multiplexed input/output (I/O) system detects leakage currents on a selected input channel. The system includes a leakage detection multiplexer connected to provide an output selected from one of a plurality of input channels. In addition, the leakage detection multiplexer provides as part of the output measured leakage currents associated with the selected input channel. Based on the detected leakage currents, a determination can made regarding whether the detected leakage currents have compromised the integrity of the multiplexer output. In addition, the detected leakage current can be used to compensate the output provided by the multiplexer to account for the presence of leakage currents on the selected channel.

5 Claims, 6 Drawing Sheets

DETECTION AND COMPENSATION OF MULTIPLEXER LEAKAGE CURRENT

CROSS-REFERENCE TO RELATED APPLICATION(S)

This application is a Divisional Application of U.S. application Ser. No. 12/584,468, filed Sep. 4, 2009, entitled "DETECTION AND COMPENSATION OF MULTIPLEXER LEAKAGE CURRENT".

BACKGROUND

The present invention relates to multiplexers, and in particular, to a multiplexer architecture for detecting leakage currents between input channels.

A multiplexer is a device that provides an output selected from a plurality of inputs. Multiplexers are beneficial because they allow more expensive resources (such as analog-to-digital converters) to be shared by a plurality of devices. In this way, rather than employ a separate analog-to-digital converter for each device, a single analog-to-digital converter may be employed for a plurality of devices.

A plurality of switches (e.g., metal-oxide semiconductor devices, opto-couplers, etc.) employed by the multiplexer are controlled (i.e., opened and closed) to select the desired input (i.e., channel) to provide at the output of the multiplexer. Ideally, the switches when open provide total isolation between each of the plurality of channels. In actuality, even when open the switches allow small amounts of current to leak between channels. This undesirable current is referred to as 'leakage current', the result of which can have a negative impact on the integrity of the signal provided at the output of the multiplexer.

In many applications, leakage currents are insubstantial and do not significantly affect the integrity of the multiplexer output. However, factors such as temperature and device-to-device potentials (i.e., input devices of the multiplexer being maintained, either intentionally or unintentionally at significantly different potentials), either alone or in combination, increase the leakage current associated with switches employed by the multiplexer.

In many applications (such as process control applications), even a small change in the integrity of the signal provided by the multiplexer may result in significant application errors. It would therefore be beneficial to detect the presence of leakage currents and/or compensate the output signal provided by the multiplexer in response to detected leakage currents.

SUMMARY

A multiplexed input/output (I/O) system detects leakage currents on a selected input channel. The system includes a leakage detection multiplexer connected to provide an output selected from one of a plurality of input channels and a leakage output indicative of leakage current associated with a selected input channel. In response to the leakage output exceeding a threshold value, a controller provides notification indicating a loss of integrity associated with the selected input channel.

DETAILED DESCRIPTION

In general, the present invention is a multiplexed input/output system that provides for the detection and/or compensation of leakage currents associated with the multiplexer. In particular, the multiplexer employed by the present invention includes with respect to each input channel at least one leakage current sense resistor, as well as additional bus lines and switches necessary to measure the voltage across the leakage current sense resistor. Based on the measured voltage across the leakage current sense resistor, the leakage current associated with a particular channel can be estimated and employed to determine whether the integrity of the output provided by the multiplexer has been compromised by the detected leakage current. A warning signal can be provided in response indicating the potential loss of integrity associated with the particular channel and/or channels.

In addition to detecting the presence of leakage currents, the present invention may provide compensation to the output signal provided by the multiplexer based on the detected leakage currents. The compensation corrects for errors introduced into the output signal by the leakage current. A benefit of this approach is signal integrity is maintained despite conditions (e.g., high temperatures, large device-to-device potentials) that would render a typical multiplexer inoperable.

Figure 1:
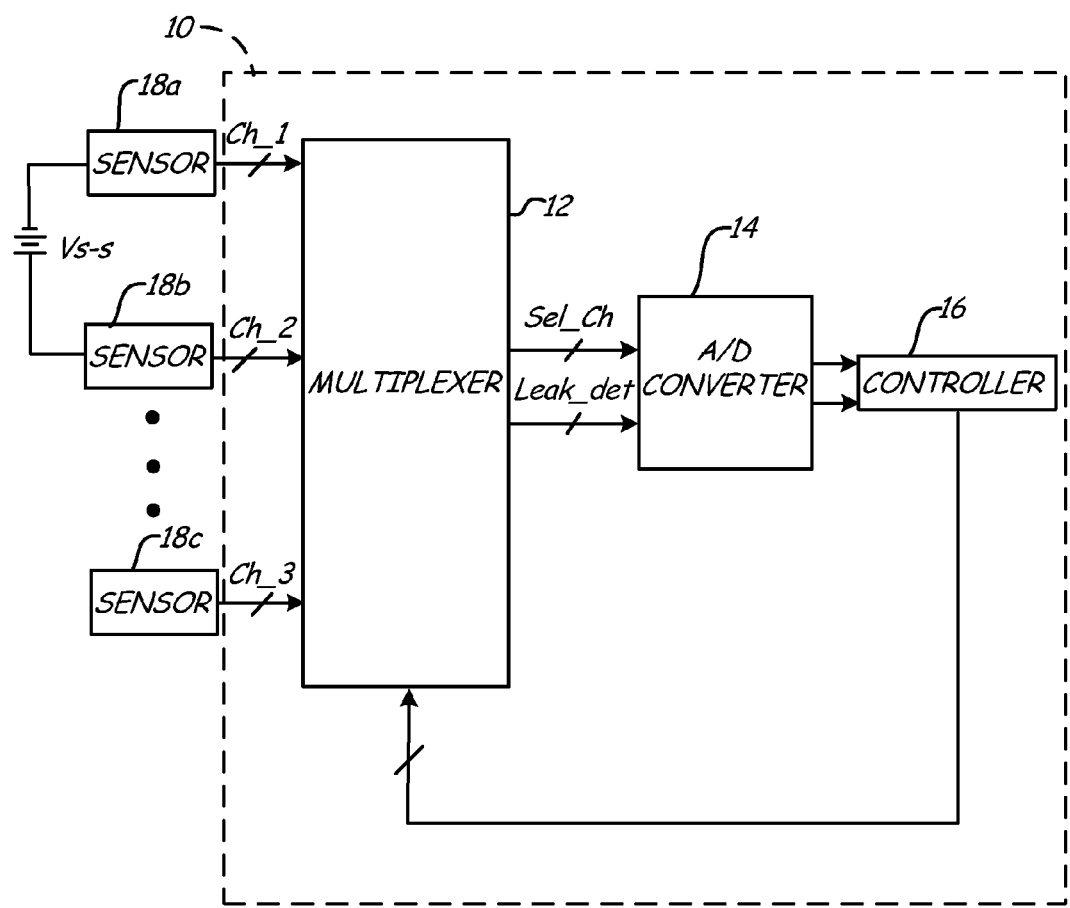
FIG. 1 is a block diagram of an input/output (I/O) system for providing leakage current detection/compensation according to an embodiment of the present invention.

FIG. 1 is a block diagram of input/output (I/O) system 10 according to an embodiment of the present invention. System 10 includes leakage current detection multiplexer 12 (hereinafter multiplexer 12), analog-to-digital (A/D) converter 14, and controller 16. Multiplexer 12 is connected to a plurality of input channels Ch_1, Ch_2 . . . Ch_3 (collectively, "input channels"), each connected to one of plurality of sensor devices 18a, 18b, and 18c, respectively (collectively, "sensor devices 18"). Each input channel may consist of one or more input lines (i.e., terminals). For example, sensor device 18a may be a two-lead thermocouple. As such, multiplexer 12 would include two input terminals with respect to sensor device 18a. Other types of sensor devices employ various lead configurations. As such, multiplexers are typically designed to accommodate a variety of sensor types, commonly employing four input terminals with respect to each channel.

Multiplexer 12 includes a plurality of switches (embodiments of which are described in more detail with respect to FIGS. 2A, 2B, 4 and 5) that are selectively controlled (i.e., opened and closed) by controller 16 to determine which of the plurality of input channels to provide at the common output of multiplexer 12. To select a particular input channel (e.g., input channel Ch_1), switches associated with the selected channel are closed and the input provided at the selected input channel is provided at a common output of multiplexer 12. Switches connected to the remaining, unselected input channels (e.g., input channels Ch_2, Ch_3) remain open to isolate the non-selected input channels from the selected input channel.

The presence of a potential difference (labeled 'Vs–s') between adjacent sensors (e.g., between sensors 18a and 18b) can contribute to the presence of crosstalk or leakage current between the respective input channels. Leakage currents distort the input signal provided at a selected input channel, and if significant will result in the erroneous interpretation of the process variable measured by a corresponding sensor. As described in more detail below, the architecture of multiplexer 12 according to embodiments of the present invention allow leakage currents associated with one or more of the plurality of input channels to be detected. The detected leakage current (labeled 'leak_det') is provided as an output of multiplexer 12 along with the sensor input provided by the selected input channel (labeled 'Sel_Ch') to A/D converter 14. A digital representation of the detected leakage current is provided to controller 16 to determine whether an alarm or notification should be sent indicating the loss of integrity associated with the selected input channel and/or to allow controller 16 to provide compensation to the signal provided by the selected input channel based on the detected leakage current.

Figure 2A:
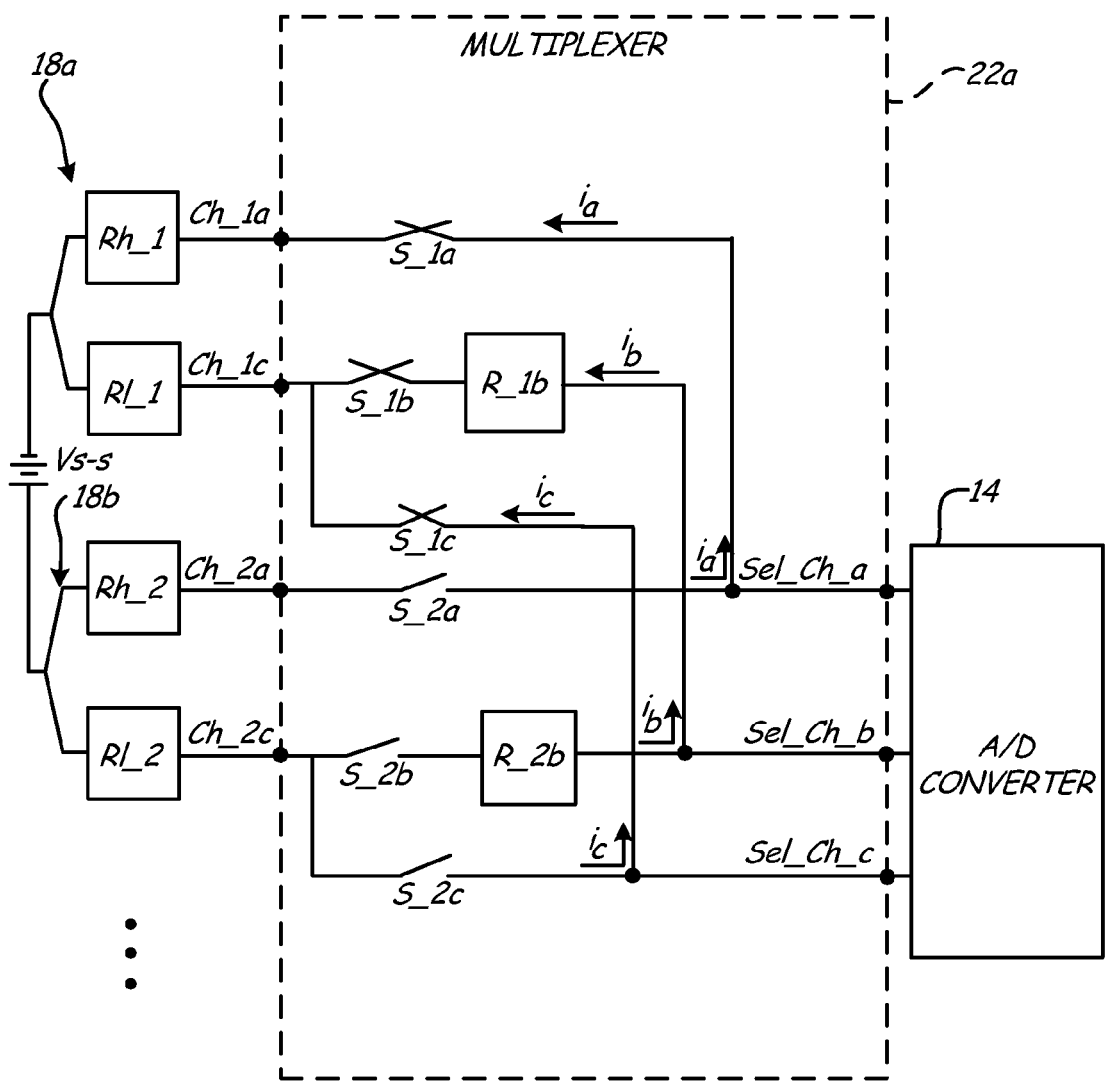
FIGS. 2A and 2B are circuit diagrams illustrating in more detail embodiments of the leakage current detection multiplexer according to the present invention.
Figure 2B:
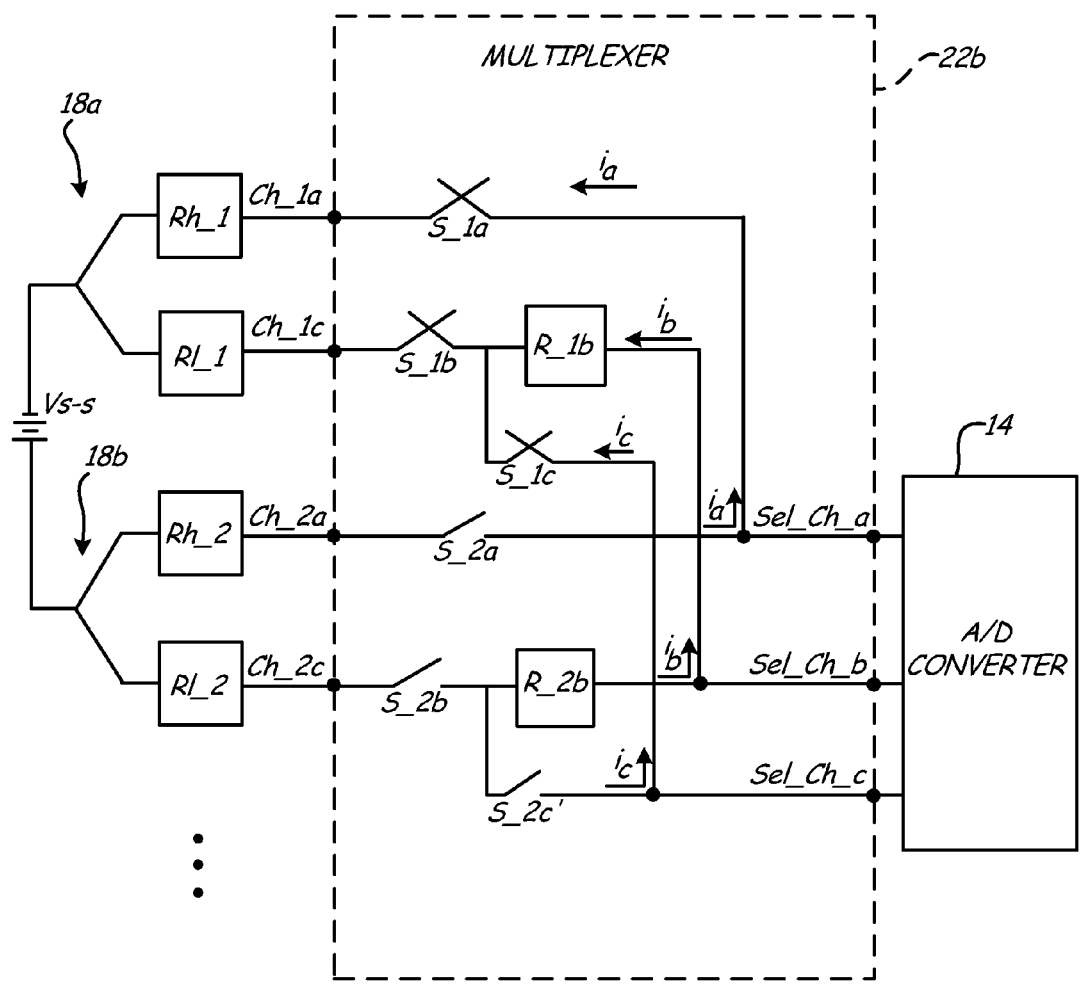

FIGS. 2A and 2B are circuit diagrams illustrating in more detail embodiments of the leakage current detection multiplexer (labeled multiplexer 22a and multiplexer 22b, respectively) according to the present invention. In the embodiment shown in FIG. 2A, multiplexer 22a is connected to receive sensor data from a plurality of input channels, two of which are shown (i.e., input channels Ch_1 and Ch_2). Multiplexer 22a includes a plurality of input terminals Ch_1a, Ch_1c, Ch_2a, and Ch_2c, a plurality of switches S_1a, S_1b, S_1c, S_2a, S_2b, and S_2c, a plurality of leakage current sense resistors R_1b and R_2b, and a plurality of output terminals Sel_Ch_a, Sel_Ch_b, and Sel_Ch_c that make up the common output channel of multiplexer 22a.

Components employed by multiplexer 22a are labeled to indicate both the input channel and output terminal associated with the component. For example, the input terminal associated with input channel Ch_1, connected to provide an output at output terminal Sel_Ch_a (via switch S_1a) is labeled Ch_1a. The other input terminal associated with channel Ch_1, connected to provide an output at output terminal Sel_Ch_c (via switch S_1c) is labeled Ch_1c. The leakage sense resistor associated with input channel Ch_1 is labeled R_1b because it is connected (via switch S_1b) to output terminal Sel_Ch_b. Components associated with input channel Ch_2 are similarly labeled, with input terminals Ch_2a and Ch_2c, switches S_2a, S_2b, and S_2c, and leakage current resistor R_2b. Input terminals Ch_2a and Ch_2c are connected to output terminals Sel_Ch_a and Sel_Ch_c, respectively, through switches S_2a and S_2c, respectively. Leakage sense resistor R_2b is connected to output terminal Sel_Ch_b via switch S_2b.

To facilitate the description of multiplexer 22a, sensors 18 are illustrated here as simple two-terminal thermocouple devices, each device including a high-lead resistance Rh and a low-lead resistance Rl connected to respective input terminal (e.g., sensor device 18a is connected to input terminals Ch_1a and Ch_1c). A typical thermocouple would further include an artificial cold junction using some other thermally sensitive device, such as a thermistor or diode, to measure the temperature of the input connections at the instrument although for purposes of this discussion the simple configuration illustrated will suffice.

To select a particular input channel to provide at the common output channel of multiplexer 22a, each switch associated with the selected input channel is closed. As shown in FIG. 2A, switches S_1a, S_1b and S_1c are closed to select input channel Ch_1. Conversely, switches associated with non-selected channels are opened to isolate the selected channel from the non-selected channels. Ideally, an open switch represents an infinite resistance that effectively prevents any current from flowing through a non-selected channel. From a practical standpoint, however, an open switch has a finite resistance that varies based on individual characteristics of the switch as well as external factors such as the temperature associated with the switch. Coupled with the presence of sensor-to-sensor potential differences (illustrated by the voltage 'Vs–s'), leakage currents may be induced through the open switches as shown in FIG. 2A, in which leakage currents ia, ib, and ic flow through open switches S2-A, S2-B and S2-C, respectively. Because each of the channels is connected to a common output (output terminals Sel_Ch_a, Sel_Ch-b, and Sel_Ch_c), the leakage currents ia, ib and ic flow through open switches S_2a, S_2b and S_2c and are provided through closed switches S_1a, S_1b and S_1c, respectively.

Resulting leakage currents ia, ib, and ic flow through thermocouple leads Rh_1 and Rl_1, resulting in a voltage drop that modifies (assuming unequal resistances associated with leads Rh_1 and R1_1) the potential difference provided by the thermocouple at input terminals Ch_1a and Ch_1c. As a result, the output provided by multiplexer 22a (at output terminals Sel-Ch_a and Sel_Ch_c) representing the sensed temperature will include some distortion due to the leakage current.

Detection of leakage current by multiplexer 22a is provided by the addition of leakage sense resistor (e.g., leakage sense resistor R_1b provided with respect to input channel Ch_1) and an additional bus line and output terminal (e.g., output terminal Sel_Ch_b) for measuring the voltage drop across leakage sense resistor R_1b. To determine the leakage current associated with a particular channel, the plurality of switches associated with the selected channel are closed, including the switch associated with the leakage sense resistor, and the voltages associated with each bus line are provided at the respective output terminals of multiplexer 22a.

For example, to measure leakage currents associated with channel Ch_1, switches S_1a, S_1b, and S_1c are closed (all remaining switches included within multiplexer 22 remain open), and the voltage across current sense resistor R_1b is measured by way of the voltage difference provided at output terminals Sel_Ch_b and Sel_Ch_c. The voltage difference across current sense resistor R_1b, combined with knowledge of the resistance value of resistor R_1b, allows the leakage current ib to be determined. In this embodiment, the current into terminal Ch_1a is not measured, and the current into terminal Ch_1c is known only to the extent that the leakage current ib can be attributed to leakage current is (the sum of which determines the actual leakage current into terminal Ch_1c). However, for purposes of detecting a loss of sensor integrity (i.e., loss of integrity associated with the sensor data provided by the selected input channel to the common output channel, in this case, at output terminals Sel_Ch_a and Sel_Ch_c), knowledge regarding the magnitude of the leakage current through one of the bus lines is typically sufficient.

The voltage values provided at output terminals Sel_Ch_a, Sel_Ch_b and Sel_Ch_c are provided to A/D converter 14, which converts the analog voltage values to digital values. A/D converter 14 provides the digital values to controller 16, which interprets the provided values. For example, a two-terminal thermocouple device provides a voltage difference at the terminals that reflects the measured temperature. Controller 16 would interpret the voltages provided at output terminals Sel_Ch_a and Sel_Ch_c (connected to input terminals Ch_1a and Ch_1c, respectively) to determine the temperature measured by sensor device 18a. In addition, controller 16 determines based on the detected leakage current (represented by the voltage difference provided between output terminals Sel_Ch_b and Sel_Ch_c) whether the detected leakage current has compromised the integrity of the output provided by multiplexer 22a. This may include comparing the measured leakage current to a threshold value or reporting the sensed leakage current to a user or control room. In other embodiments, controller 16 may compensate the signal provided by the sensor to account for the leakage current, but accurate compensation is improved by knowledge of the leakage current through each input terminal of the selected channel (as described with respect to FIGS. 4 and 5).

Similar operations may be performed with respect to each input channel. Depending on the application, A/D converter 14 and controller 16, both of which represent relatively expensive operations, may only periodically review the leakage current associated with each of the plurality of inputs. This is typically acceptable as the factors giving rise to large leakage currents (e.g., temperature and sensor-to-sensor potential) are typically slow to change. In other applications, however, it may be beneficial to continuously monitor the presence of leakage currents.

FIG. 2B is a circuit diagram illustrating in more detail another embodiment of the leakage current detection multiplexer (labeled multiplexer 22b to differentiate between multiplexer 22a described with respect to FIG. 2A). Multiplexer 22b includes the same components described with respect to multiplexer 12a shown in FIG. 2A, including a plurality of input terminals Ch_1a, Ch_1c, Ch_2a and Ch_2c, a plurality of switches S_1a, S_1b, S_1c', S_2a, S_2b and S_2c', a plurality of leakage current sense resistors R_1b and R_2b, and a plurality of output terminals Sel_Ch_a, Sel_Ch_b and Sel_Ch_c.

The difference between this embodiment and that shown in FIG. 2A is the connection of switches S_1c' and S_2c' (the prime notation indicates schematic differences between the embodiments). In FIG. 2A, a first side of switch S_1c was connected to input terminal Ch_1c and the second side was connected to output terminal Sel_Ch_c. In this embodiment, the first side of switch S_1c' is connected between switch S_1b and current leakage resistor R_1b. The second side of switch S_1c' remains connected to output terminal Sel_Ch_c. Likewise, the first side of switch S_2c' is connected between switch S_2b and currently leakage resistor R_2b.

The benefit of this approach is a majority of the leakage current that flows into terminal Ch_1c is attributable to leakage current ib (as opposed to a combination of leakage currents ib and ic), which can be measured based on the measured voltage drop across current leakage resistor R_1b. Assuming leakage current is due, in large part, to the presence of a large sensor-to-sensor potential difference Vs–s, by connecting the first side of switch S_2c' on the opposite side of switch S_2b, a majority of the potential difference will drop across open switch S_2b (due to the relatively high, although not infinite, resistance associated with an open switch). As a result, the first side of switch S_2c' is connected to a node of significantly lower potential than the first side of switch S_2c (as shown in FIG. 2A), and the magnitude of leakage current is flowing through open switch S_2c' is significantly less than the leakage current ib flowing through open switch S_2b.

As a result, the leakage current estimated based on the voltage difference measured across leakage sense resistor R_1b more accurately portrays the leakage current flowing into input terminal Ch_1c. The leakage current provided to input terminal Ch_1a remains unknown in this embodiment, but once again may be estimated based on the measured leakage current associated with input terminal Ch_1c.

Figure 3A:
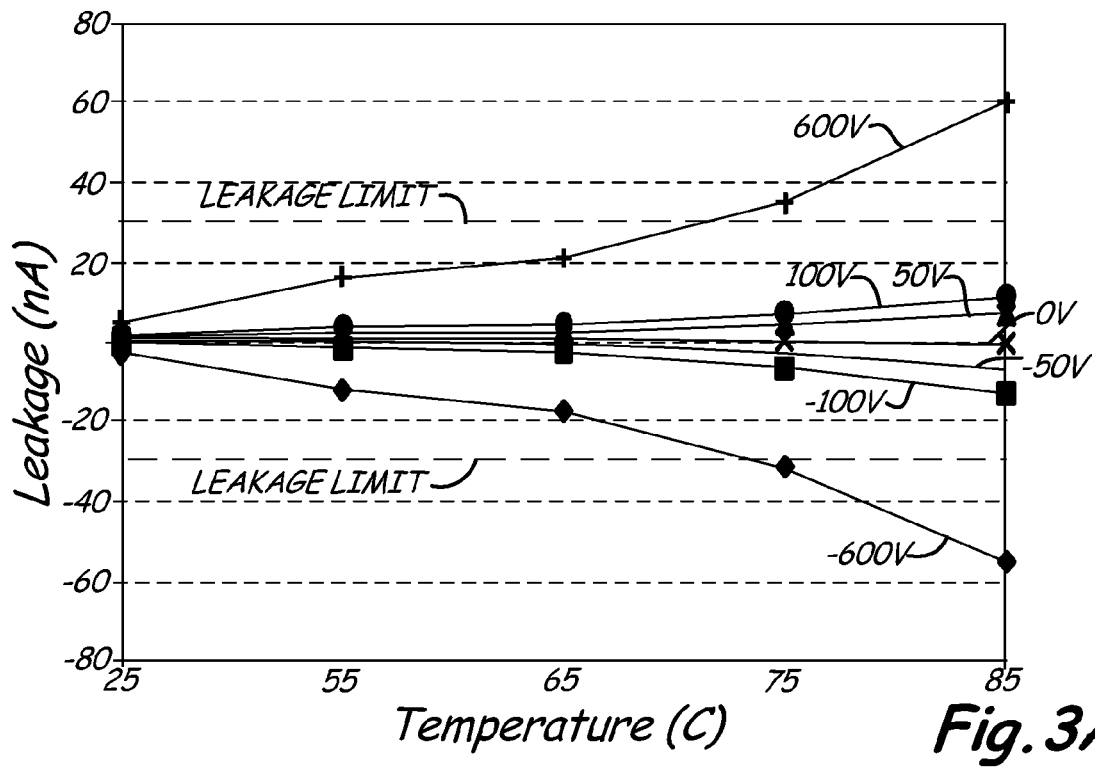
FIGS. 3A and 3B are graphs illustrating the correlation between leakage current and the integrity of measurements provided by the multiplexer and limits used to indicate excessive leakage current.
Figure 3B:
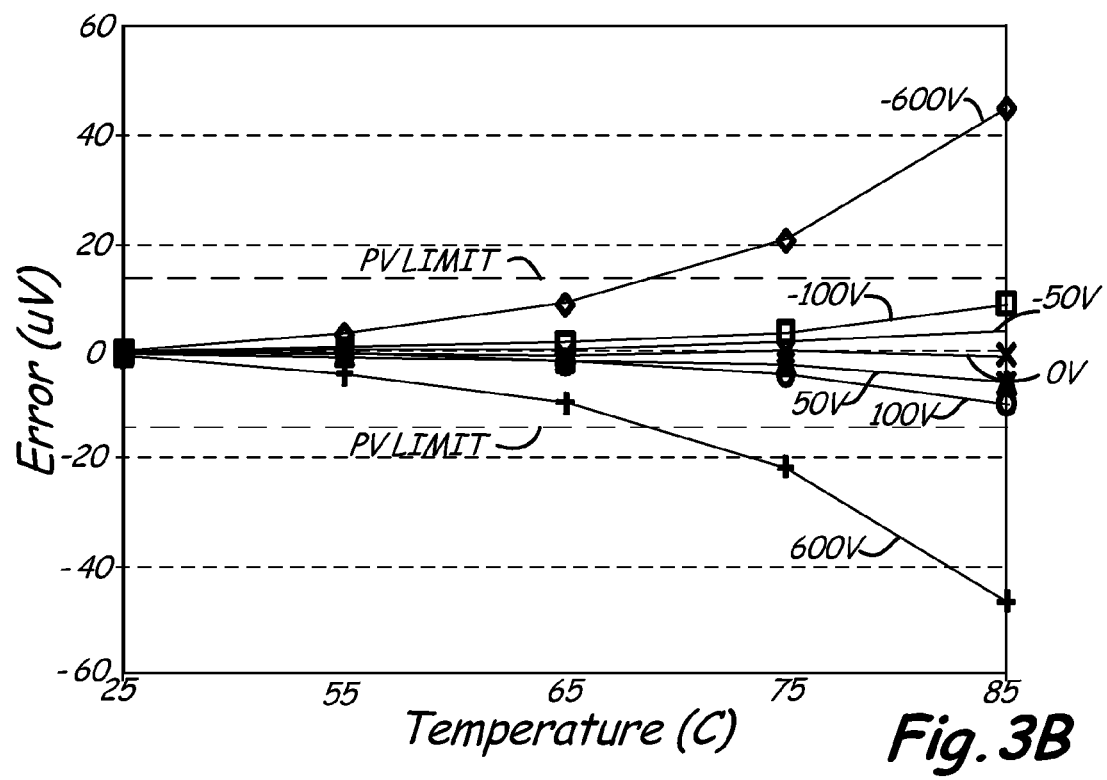

FIGS. 3A and 3B are graphs illustrating the correlation between sensor-to-sensor voltage and temperature with leakage current magnitudes as well as an example of how leakage current thresholds are employed to determine loss of sensor integrity. FIGS. 3A and 3B are from prototypes based on the circuit diagram described with respect to FIG. 2A, but the principles remain valid for the embodiment described with respect to FIG. 2B.

FIG. 3A illustrates how sensor-to-sensor potential and temperature affects leakage current. The y-axis represents current magnitudes (e.g., nano-Ampere ($\eta A$) units) and the x-axis represents ambient temperatures (e.g., Celsius units) associated with a multiplexer (i.e., the temperature does not necessarily represent temperature value sensed by the sensor, only ambient temperatures associated with the multiplexer). Each line represents leakage currents sensed with respect to varying magnitudes of sensor-to-sensor potential Vs–s, labeled '–600 V', '–100 V', '0 V', '50 V', '100 V', and '600 V', respectively. Threshold limits identifying the leakage current amplitude at which point the integrity of sensed process variables (pv) is compromised are illustrated at 30 $\eta A$ and at –30 $\eta A$ (labeled 'leakage limit'). These thresholds are determined based at the point (shown in FIG. 3B) at which the sensed process variable exceeds defined specification limits (provided at 15 $\mu V$ and –15 $\mu V$).

As shown in FIG. 3A, leakage currents increase with increasing temperature and with increased sensor-to-sensor potential Vs–s. In particular, when the sensor-to-sensor potential Vs–s equals 600 V (represented by the line labeled '600 V'), the leakage current matches the leakage limit when the ambient temperature reaches 75° C., and exceeds the leakage limit when the ambient temperature reaches 85° C. Exceeding the leakage limit indicates that errors associated with the sensed process variables have exceeded specification limits (shown in FIG. 3B) such that the integrity of the sensor signal has been compromised.

FIG. 3B illustrates how leakage currents generated by increasing sensor-to-sensor potential Vs–s and increasing temperature negatively impacts the sensed process voltage, and therefore the integrity of the sensed process variable. The y-axis represents error values (micro-Volts ($\mu V$) units) introduced into the sensed process variable and the x-axis represents ambient temperatures (Celsius) associated with a multiplexer with the same scale as that employed with respect to FIG. 3A. Once again, each line represents process variable errors measured with respect to varying amplitudes of sensor-to-sensor potential Vs–s, labeled '–600 V', '–100 V', '–50 V', '0 V', '50 V', '100 V', and '600 V', respectively. Specification limits (labeled 'pv limits') are defined to indicate the point at which the integrity of sensed process variables has been compromised (e.g., 15 $\mu V$ and –15 $\mu V$). In this simulation, errors in the sensed process variable exceed the specification limit at a temperature of 75° C. and a sensor-to-sensor voltage of |600| V (i.e., at 600 V and –600 V). The leakage current generated at this temperature and sensor-to-sensor potential, as shown in FIG. 3A, becomes the leakage current threshold (also shown in FIG. 3A). In this way, leakage currents that exceed the defined threshold indicate a loss of integrity, as defined by the sensed process voltage.

Leakage limits are determined with respect to a particular sensor based on knowledge regarding how leakage currents will affect sensor integrity. The leakage current limits can be estimated based on information known about the type of sensor being employed, including the resistance of the sensor and the differential resistance associated with each lead, or may be determined by applying a known current to the sensor and measuring a resulting voltage (in much the same way a current is applied to a two-lead resistive temperature device (RTD)) to determine the resistance of a particular sensor. Knowing the resistance of the sensor (e.g., with respect to thermocouple devices, knowing the resistivity ratio associated with each lead of the thermocouple) determines the effect leakage currents will have on the integrity of the signal. For example, with respect to thermocouples, the larger the resistivity ratio between terminals, the more prominent the effect the leakage current will have on sensor integrity.

Figure 4:
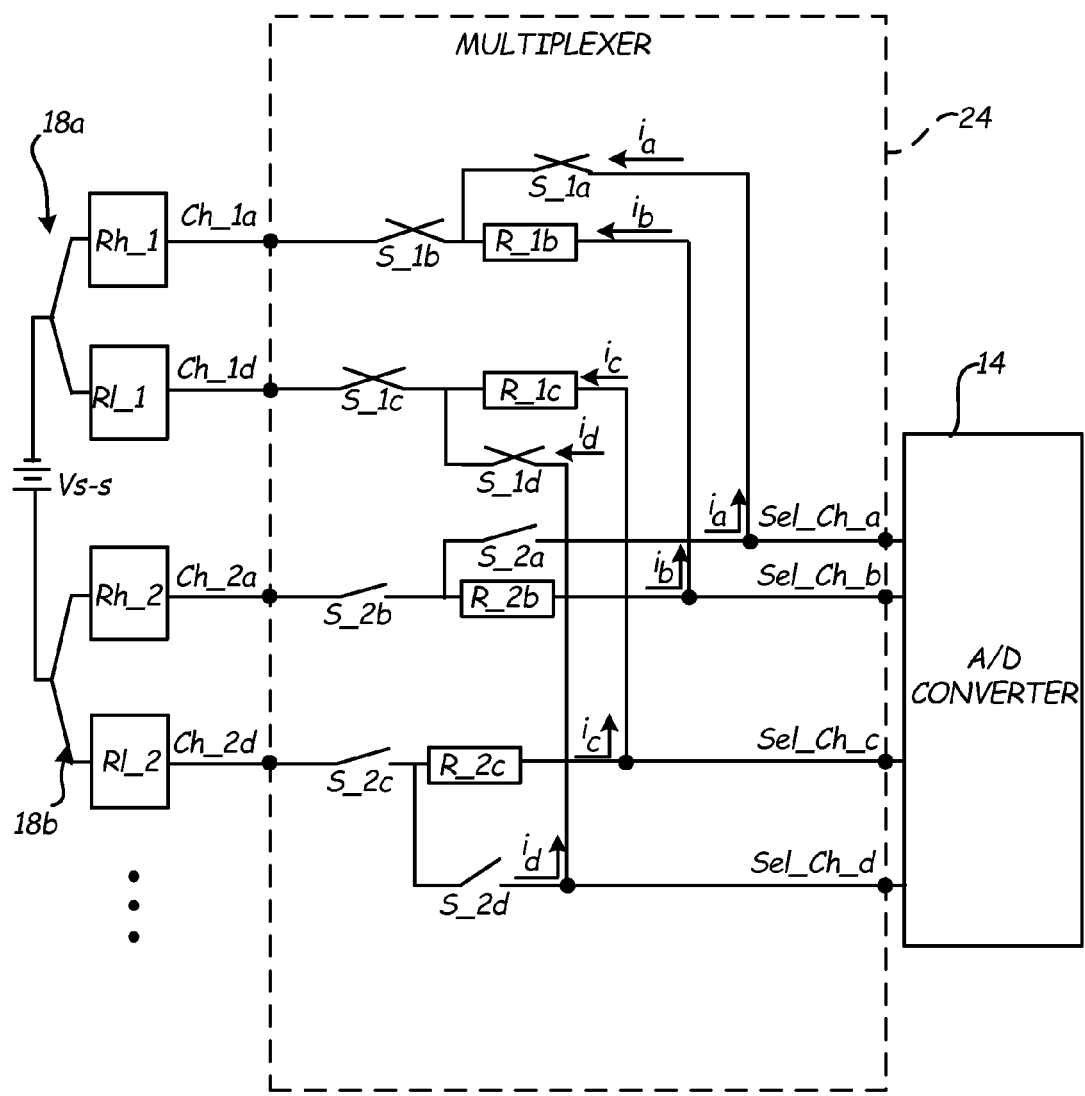
FIG. 4 is a circuit diagram illustrating in more detail the leakage current detection multiplexer according to an embodiment of the present invention.

FIG. 4 is a circuit diagram illustrating another embodiment of leakage current detection multiplexer (labeled here as multiplexer 24) according to the present invention.

In the embodiment shown in FIG. 4, multiplexer 24 is once again connected to receive sensor data from a plurality of input channels, two of which are shown (input channels Ch_1 and Ch_2). Once again, the description is simplified by the assumption of two-terminal devices connected to each of the respective input channels. Multiplexer 24 includes a plurality of input terminals Ch_1a, Ch_1d, Ch_2a and Ch_2d, a plurality of switches S_1a, S_1b, S_1c, S_1d, S_2a, S_2b, S_2c and S_2d, a plurality of leakage sense resistors R_1b, R_1c, R_2b and R_2c, and a plurality of output terminals Sel_Ch_a, Sel_Ch_b, Sel_Ch_c and Sel_Ch_d making up the common output channel of multiplexer 24.

Components employed by multiplexer 24 are once again labeled to indicate both the input channel and output terminal associated with the component. For example, the input terminal associated with input channel Ch_1, connected to provide an output at output terminal Sel_Ch_a (via switch S_1a), is labeled Ch_1a. The other input terminal associated with channel Ch_1, connected to provide an output at output terminal Sel_Ch_d (via switch S_1d), is labeled Ch_1d. The leakage sense resistors associated with input channel Ch_1 connected (via switches S_1b and S_1c, respectively) to output terminals Sel_Ch_b and Sel_Ch_c are labeled R_1b and R_1c, respectively.

In contrast with the embodiment described with respect to FIGS. 2A and 2B, this embodiment includes a leakage sense resistor associated with each of the plurality of input terminals. Although this embodiment results in an increase in the complexity associated with multiplexer 24, a benefit of the additional bus lines and associated leakage sense resistors is the ability to know the leakage current at each input terminal. Knowledge of the leakage current through each input terminal can be used to compensate the sensor signal provided on a selected input channel.

For instance, in the example shown in FIG. 4, switches S_1a, S_1b, S_1c, and S_1d are closed to select input channel Ch_1. Switches associated with non-selected channel remain open. The sensor input provided by sensor 18a is provided as a voltage difference at output terminals Sel_Ch_a and Sel_Ch_d, respectively. Leakage current ib flowing into input terminal Ch_1a is determined based on the voltage drop across leakage sense resistor R_1b, measured as the voltage difference between output terminals Sel_Ch_a and Sel_Ch_b. Leakage current is flowing into input terminal Ch_1d is determined based on the voltage drop across leakage sense resistor R_1c, measured as the voltage difference between output terminals Sel_Ch_c and Sel_Ch_d. In this way, the embodiment shown in FIG. 4 provides information regarding the leakage current provided to both input terminals (e.g., input terminal Ch_1a and Ch_1d) associated with a particular channel.

Figure 5:
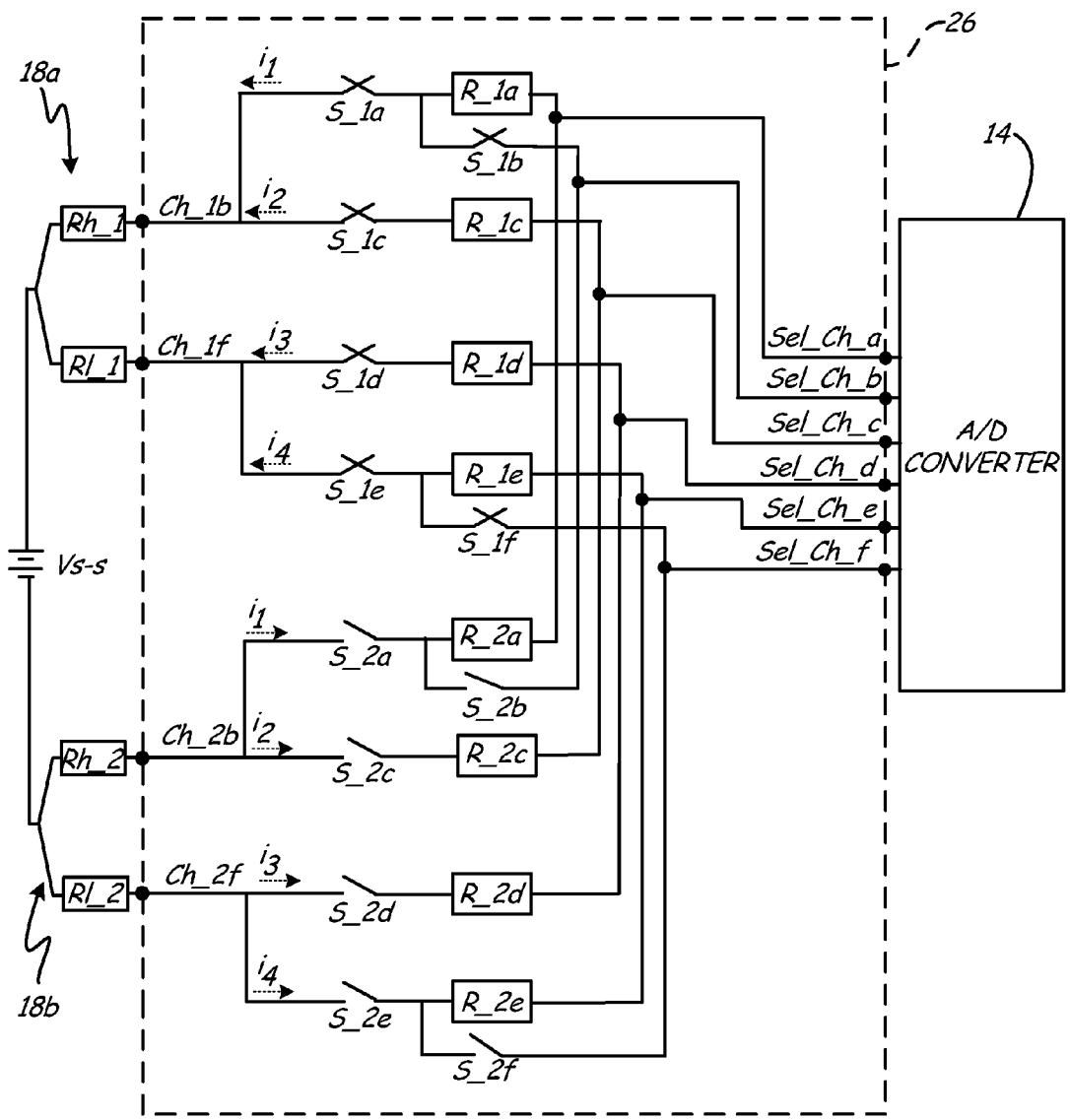
FIG. 5 is a circuit diagram illustrating in more detail the leakage current detection multiplexer according to an embodiment of the present invention.

The present embodiment does not measure the leakage currents ia and id, and thus the actual leakage current provided to the input terminals Ch_1a and Ch_1d is known only to the extent the measured leakage currents ib and ic can be attributed to the remaining bus lines. Applicants in which three- or four-terminal sensor devices are connected to a particular input channel may required knowledge of the leakage currents through those additional bus lines (as shown in FIG. 5). However, a majority of the leakage current that flows into terminals Ch_1a and Ch_1d is attributable to leakage current ib and ic, respectively, as opposed to a combination of leakage currents ia and ib, and leakage currents ic and id. Leakage currents ib and ic are known based on the measured voltage drop across leakage resistor R_1b and R_1c, respectively. This is attributable, once again, to the large potential across switches S_2b and S_2c, respectively, and the relatively small potential across switches S_2a and S_2d, which results in relatively small leakage currents ia and id.

As a result, the leakage current estimated based on the voltage difference measured across leakage sense resistors R_1b and R_1c accurately portrays the leakage current flowing into input terminals Ch_1a and Ch_1d. Calculating the effect of the leakage current on the voltage between the input terminals Ch_1a and Ch_1d requires knowledge of the high-side resistance (Rh_1) and low-side resistance (R1_1). In one embodiment, a regular 2-wire ohmic measurement across the thermocouple, measuring a total resistance associated with the device, coupled with knowledge of the type of device, which determines the ratio between the high-side resistance and the low-side resistance, allows the high-side resistance and low-side resistance to be individually determined. The compensation to be added to a thermocouple device having a known high-side resistance and low-side resistance is defined by the following exemplary equation:

$$V_{comp} = -ib*Rh\_1 + ic*Rl\_1 \qquad \text{Eq. 1}$$

The voltage compensation calculated using Equation 1 takes into account the voltage drop attributable to leakage current ib flowing through high-side resistor Rh_1 and the voltage drop attributable to leakage current ic flowing through low-side resistor R1_1.

For purposes of detecting a loss of sensor integrity due to the presence of leakage currents, knowledge regarding the leakage currents at one of the input terminals is typically sufficient. With information regarding the flow of leakage currents into each terminal of the input channel, along with knowledge regarding the high-side resistance Rh_1 and low-side resistance R1_1, the effect of the leakage current on the voltage provided at input terminals Ch_1a and Ch_1d can be compensated.

The outputs provided by multiplexer 24, including outputs representing the sensor signal (e.g., voltage difference between output terminals Sel_Ch_a and Sel_Ch_d) and outputs representing the voltage drop across the respective leakage sense resistors (e.g., voltage difference between output terminals Sel_Ch_a and Sel_Ch_b, and between output terminals Sel_Ch_c and Sel_Ch_d) are converted to digital values by A/D converter 14 and provided to controller 16. Based on the provided outputs, controller 16 calculates the process variable measured by the sensor connected to the selected channel (in this case, the temperature measured by the thermocouple) and compensates the measured sensor signal based on the calculated leakage currents (e.g., as shown in Equation 1). A benefit of this approach is despite the presence of leakage currents that would otherwise compromise the integrity of the sensor signal, the present invention is able to provide compensation to correct for the detected presence of leakage currents.

Similar operations may be performed with respect to each input channel. Depending on the application, A/D converter 14 and controller 16, both of which represent relatively expensive operations, may only periodically review the leakage current associated with each of the plurality of inputs, applying the previously calculated compensation signal to the sensor signal. This is typically acceptable as the factors giving rise to large leakage currents (e.g., temperature and sensor-to-sensor potential) are typically slow to change. In other applications, however, it may be beneficial to monitor the leakage currents with respect to each selected channel. This improves the accuracy of the signal by continually updating the compensation provided to the sensor signal.

FIG. 5 is a circuit diagram illustrating in more detail another embodiment of the leakage current detection multiplexer (labeled here as multiplexer 26). As compared with the multiplexer described with respect to FIG. 4, multiplexer 26 includes additional bus lines associated with each channel and additional leakage sense resistors for measuring the leakage resistor into the input terminals of multiplexer 26. Multiplexer 26 includes a plurality of input terminals Ch_1b, Ch_1f, Ch_2b, and Ch_2f, a plurality of switches S_1a, S_1b, S_1c, S_1d, S_1e, S_1f, S_2a, S_2b, S_2c, S_2d, S_2e, and S_2f, a plurality of leakage sense resistors R_1a, R_1c, R_1d, R_1e, R_2a, R_2c, R_2d, and R_2e, and a plurality of output terminals Sel_Ch_a, Sel_Ch_b, Sel_Ch_c, Sel_Ch_d, Sel_Ch_e, and Sel_Ch_f making up the common output channel. Components are once again labeled to indicate both the input channel and output terminal associated with the component.

The additional bus lines allow multiplexer 26 to provide leakage current detection associated with sensors employing four terminals per channel. For instance, although sensor 18a is illustrated here as a thermocouple device, it may be replaced with a resistive temperature device (RTD) having a resistance that varies with temperature. RTD devices may be three-terminal devices or four-terminal devices. In a four-terminal device, current is provided to the RTD device via two terminals. The other two terminals are high-impedance paths for measuring the voltage generated across the RTD in response to the provided current. With a known current, the measured voltage is used to determine the resistance of the RTD, and therefore the corresponding temperature of the device.

In this embodiment, only leakage currents provided at each input terminal are labeled, as opposed to previous embodiments in which leakage currents were associated with each bus line. Therefore, leakage currents i1 and i2 are provided between terminals Ch_2b and Ch_1b, and leakage currents i3 and i4 are provided between terminals Ch_2f and Ch_1f.

To select a particular input channel to provide at the common output channel of multiplexer 26, each switch associated with the selected input channel is closed. In the example shown in FIG. 5, switches S_1a, S_1b, S_1c, S_1d, S_1e, and S_1f are closed to select channel Ch_1. Conversely, switches associated with non-selected channels are opened (or remain open) to isolate the selected channel from the non-selected channels. As discussed above, leakage currents may develop between the selected channel and the non-selected channel. In this embodiment, leakage currents may develop between each of the plurality of bus lines, but the leakage current is typically insubstantial in bus lines associated with switches S_1b and S_1f. For example, switch S_2f is connected between switch S_2e and resistor R_2e. When switch S_2e is open (i.e., high impedance), a majority of the sensor-to-sensor voltage Vs–s is provided across switch S_2e, such that switch S_2f has a minimal voltage drop. As a result, minimal leakage current is provided via switch S_2f to switch S_1f. The same is true with respect to switch S_2b, with little or no leakage current being provided to switch S_1b.

With this in mind, leakage currents i1, i2, i3 and i4 can be accurately determined by measuring the voltage across leakage sense resistor R_1a, R_1c, R_1d, and R_1e, respectively. Leakage current i1 is determined by measuring the voltage on either side of current sense resistor R_1a via output terminals Ch_Sel_a and Ch_Sel_b. The measured voltage across leakage sense resistor R_1a, combined with knowledge of the resistance value of resistor R_1a allows the leakage current i1 to be determined. Likewise, the leakage current i2 is determined by measuring the voltage on either side of current sense resistor R_1c via output terminals Ch_Sel_b and Ch_Sel_c. Resistors R_1d and R_1e are similarly employed to measure the leakage currents i3 and i4 flowing into input terminal Ch_1f. Leakage currents i1 and i2 are combined to determine the leakage current into input terminal Ch_1b and leakage currents i3 and i4 are combined to determine the leakage current into input terminal Ch_1f.

As discussed above, the voltage values provided at the output terminals Sel_Ch_a, Sel_Ch_b, Sel_Ch_c, Sel_Ch_d, Sel_Ch_e, and Sel_Ch_f are provided to A/D converter 14, converted to digital values, and provided to a controller (e.g., controller 16 shown in FIG. 1) for analysis. For instance, sensor values are based on the voltage difference provided between output terminals Sel_Ch_b and Sel_Ch_f. Leakage current i1 is based on the voltage difference provided between output terminals Sel_Ch_a and Sel_Ch_b and leakage currents i2, i3 and i4 are based on the respective voltage differences sensed across leakage sense resistors R_1c, R_1d and R_1e.

Based on the provided output, controller 16 calculates the process variable measured by the sensor connected to the selected channel (e.g., the temperature sensed by sensor device 18a) and determines whether the magnitude of the leakage currents has compromised the integrity of the multiplexer output. Knowledge of the magnitude of leakage currents into each terminal is beneficial, as it allows controller 16 to better determine the effect the leakage currents will have on the sensed process variable.

In addition, knowledge of the leakage currents flowing into both input terminals allows the controller to calculate a compensation signal (e.g., voltage) that is added to the output provided by the selected sensor in order to compensate for the effects of the leakage current provided to respective leads of sensor device 18a. The additional bus lines allow leakage currents to be measured with respect to input channels that include multiple terminals (e.g., input channels connected to RTD devices). A benefit of this approach is despite the presence of leakage currents that would otherwise compromise the integrity of the sensor signal, the present invention is able to provide compensation to correct for the detected presence of leakage currents. In an exemplary embodiment, controller 16 employs the following equation to calculate the compensation to be applied to the sensor output provided by a thermocouple with lead resistances Rh_1 and Rl_1. As discussed with respect to Eq. 1, knowledge of the high-side resistance Rh_1 value and low-side resistance Rl_1 value, in the case of a thermocouple device, is required for the compensation calculation.

$$V\text{comp} = -((i1+i2)*Rh\_1 + i2*R\_1c) + ((i3+i4)*Rl\_1 + i3*R\_1d)) \qquad \text{Eq. 2}$$

The voltage compensation calculated as shown in Equation 2 takes into account the effect of leakage currents on the voltage drop across the high-side resistor attributable to leakage currents i1 and i2 and the voltage drop across sense resistor R_1c attributable to leakage current i2, as well as the voltage drop across the low-side resistor attributable to leakage currents i3 and i4 and the voltage drop across sense resistor R_1d attributable to leakage current i3.

Similar operations may be performed with respect to each input channel. Depending on the application, A/D converter 14 and controller 16, both of which represent relatively expensive operations, may only periodically review the leakage current associated with each of the plurality of inputs, applying the previously calculated compensation signal to the sensor signal. This is typically acceptable as the factors giving rise to large leakage currents change relatively slowly. In other applications it may be beneficial to monitor the leakage currents with respect to each selected channel. This improves the accuracy of the signal by continually updating the compensation provided to the sensor signal.

Although the present invention has been described with reference to particular embodiments, workers skilled in the art will recognize that changes may be made in form and detail without departing from the scope of the invention as claimed. For example, the multiplexer of the present invention may be configured to communicate with devices other than the simple two-terminal thermocouples described with respect to FIGS. 2A, 2B, 4 and 5. Some devices require additional input terminals with respect to each input channel. As a result, the multiplexer would include additional bus lines connected to each of the input terminals and additional output terminals to communicate each of inputs associated with a particular channel. In order to measure leakage currents associated with one or more the terminals, additional leakage sense resistors would be required with respect to one or more the input terminals. Additional bus lines would also be required in order to measure the voltage drop across each of the provided leakage sense resistors.

In addition, each of the embodiments describes the multiplexer, the A/D converter and the controller as individual components, but workers skilled in the art will recognize that these components could be incorporated together as a single element. For instance, the functions performed by each of these components may be implemented with the use of an application specific integrated circuit (ASIC) or similar device.

The invention claimed is:

1. A multiplexed input/output (I/O) system including:
a leakage detection multiplexer for receiving a sensor input at each of a plurality of input channels, for providing a sensor output selected from one of the plurality of input channels at an output channel associated with the selected input channel, and for providing a leakage output indicative of leakage current associated with a selected input channel at the output channel associated with the selected input channel, wherein the leakage detection multiplexer includes at least one leakage sense resistor connected to each of plurality of input channels, wherein the leakage output represents the voltage across the leakage sense resistor associated with the selected input channel; and
a controller for generating a notification when the output indicative of leakage current exceeds a threshold value indicating a loss of integrity associated with the selected input channel.

2. The multiplexed I/O system of claim 1, wherein the leakage detection multiplexer includes a plurality of input terminals associated with each of the plurality of input channels, wherein the leakage output is indicative of a leakage current associated with at least one of the plurality of input terminals.

3. The multiplexed I/O system of claim 1, wherein the leakage detection multiplexer includes a plurality of input terminals associated with each of the plurality of input channels, wherein the leakage output is indicative of leakage currents associated with each of the plurality of input terminals associated with a particular input channel.

4. The multiplexed I/O system of claim 3, wherein the controller calculates a compensation signal based on the leakage output provided with respect to each of the plurality of input terminals and adds the compensation signal to the sensor output to generator a compensated sensor output that accounts for the detected presence of leakage currents.

5. The multiplexed I/O system of claim 4, wherein the controller calculates the compensation signal based, in addition, on information regarding a type of sensor connected to the selected input channel and resistive values associated with the sensor connected to the selected input channel to determine the effect the monitored leakage current has on the sensor output provided by the multiplexer.

* * * * *

UNITED STATES PATENT AND TRADEMARK OFFICE
CERTIFICATE OF CORRECTION

Page 1 of 1

PATENT NO. : 9,069,029 B2
APPLICATION NO. : 13/325914
DATED : June 30, 2015
INVENTOR(S) : Andrew James Bronczyk et al.

It is certified that error appears in the above-identified patent and that said Letters Patent is hereby corrected as shown below:

In the Specification
Col. 4, Line 52
  Delete "is"
  Insert --ic--
Col. 5, Line 62
  Delete "is flowing through"
  Insert --ic flowing through--

Signed and Sealed this
First Day of December, 2015

Michelle K. Lee
*Director of the United States Patent and Trademark Office*